United States Patent
Chantre et al.

(10) Patent No.: US 7,226,844 B2
(45) Date of Patent: Jun. 5, 2007

(54) METHOD OF MANUFACTURING A BIPOLAR TRANSISTOR WITH A SINGLE-CRYSTAL BASE CONTACT

(75) Inventors: Alain Chantre, Seyssins (FR); Pascal Chevalier, Chapareillan (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 11/091,950

(22) Filed: Mar. 28, 2005

(65) Prior Publication Data

US 2005/0215021 A1 Sep. 29, 2005

(30) Foreign Application Priority Data

Mar. 29, 2004 (FR) .................................. 04 50610

(51) Int. Cl.
*H01L 21/331* (2006.01)

(52) U.S. Cl. ..................... 438/313; 438/170; 438/202; 438/234; 438/309

(58) Field of Classification Search ................ 438/189, 438/170, 202, 203, 204, 234, 235, 236, 309, 438/313, 322

See application file for complete search history.

(56) References Cited

U.S. PATENT DOCUMENTS

| 5,331,199 | A  | * | 7/1994 | Chu et al. ..................... 257/587 |
| 5,599,723 | A  |   | 2/1997 | Sato ............................. 437/31 |
| 6,177,717 | B1 |   | 1/2001 | Chantre et al. ............. 257/565 |
| 6,271,144 | B1 | * | 8/2001 | Monget et al. ............. 438/706 |
| 6,709,941 | B2 | * | 3/2004 | Fujimaki ..................... 438/341 |
| 2002/0168868 | A1 | * | 11/2002 | Todd ........................... 438/767 |
| 2004/0195655 | A1 | * | 10/2004 | Ohnishi et al. ............. 257/575 |
| 2005/0151165 | A1 | * | 7/2005 | Chan et al. .................. 257/198 |

FOREIGN PATENT DOCUMENTS

| DE | 101 04 776 A1 | 8/2002 |
| EP | 1 282 172 A2 | 2/2003 |
| FR | 2 805 924 | 9/2001 |
| WO | WO 03/049192 A1 | 6/2003 |

OTHER PUBLICATIONS

Shang, L., et al., "The Development of an Anisotropic Si Etch Process Selective to $Ge_xSi_{1-x}$ Underlayers," *Journal of the Electrochemical Society* 141(2):507-510, Feb. 1994.
Tillack, B., et al., "Monitoring of Deposition and Dry Etching of Si/SiGe Multiple Stacks," *Journal of Vacuum Science and Technology* 14(1):102-105, Part B, Jan./Feb. 1996.

* cited by examiner

Primary Examiner—Thao P. Le
(74) Attorney, Agent, or Firm—Lisa K. Jorgenson; Robert Iannucci; Seed IP Law Group PLLC

(57) ABSTRACT

A method forms a bipolar transistor in a semiconductor substrate of a first conductivity type. The method includes: forming on the substrate a single-crystal silicon-germanium layer; forming a heavily-doped single-crystal silicon layer of a second conductivity type; forming a silicon oxide layer; opening a window in the silicon oxide and silicon layers; forming on the walls of the window a silicon nitride spacer; removing the silicon-germanium layer from the bottom of the window; forming in the cavity resulting from the previous removal a heavily-doped single-crystal semiconductor layer of the second conductivity type; and forming in said window the emitter of the transistor.

20 Claims, 2 Drawing Sheets

US 7,226,844 B2

METHOD OF MANUFACTURING A BIPOLAR TRANSISTOR WITH A SINGLE-CRYSTAL BASE CONTACT

BACKGROUND OF THE INVENTION

1. Field of the Invention

The present invention generally relates to the forming in integrated form of bipolar transistors. More specifically, the present invention relates to the forming of the extrinsic base of such a transistor.

2. Description of the Related Art

FIGS. 1A to 1D illustrate, in partial simplified cross-section views, different steps of a known method for manufacturing an integrated circuit bipolar transistor.

As illustrated in FIG. 1A, a silicon oxide layer 3, a heavily-doped P-type polysilicon layer 5, and a silicon nitride layer 7 are formed on a lightly-doped N-type single-crystal silicon substrate 1.

Then, as illustrated in FIG. 1B, a window 9 is opened in nitride and polysilicon layers 7 and 5 to expose oxide layer 3. A silicon nitride spacer 11 is formed on the vertical wall of window 9.

At the next steps illustrated in FIG. 1C, oxide layer 3 is opened from the bottom of window 9 to expose substrate 1. Layer 3 is etched so that the formed recess extends from window 9 to under layer 5. A selective epitaxial growth of a heavily-doped P-type semiconductor material 13, silicon or silicon germanium, is then performed. The growth of material 13 is performed selectively on the exposed silicon portions. A central single-crystal silicon region 131 is thus formed on the upper surface of substrate 1 and a lateral polycrystalline region 132 is formed under polysilicon layer 5.

As illustrated in FIG. 1D, the method carries on with the forming of an L-shaped spacer 15 on the wall and the bottom of window 9. A heavily-doped N-type silicon layer 19 is deposited to fill window 9. Silicon layer 19 and nitride layer 7 are etched to only be left in place close to window 9. Polysilicon layer 5 is thus exposed.

The method carries on with steps not shown, especially of silicidation of silicon surfaces 5 and 19 and of forming of metallizations solid with these surfaces.

A bipolar transistor having substrate 1 as its collector, region 13 as its base, and layer 19 as its emitter has thus been formed.

A disadvantage of such a method lies in the epitaxial growth of base 13 described in relation with FIG. 1C. Indeed, region 13 comprises regions 131 and 132 of distinct crystal lattices. Polycrystalline region 132 adversely affects the nominal electric performances desired for the final transistor. Its effect is all the stronger as base region 13 is thin and as the base-emitter junction is small.

Further, the conditions of the selective growth of base 13 are relatively disadvantageous. Indeed, these conditions depend on the nature of the planar upper surface, that is, of layer 7. In the presence of silicon nitride, the selectivity of the silicon-germanium epitaxial growth requires a high-temperature epitaxy in the presence of chlorine.

Further, to optimize the electric performances of the resulting transistor, it has been shown that is was desirable for region 13 to comprise a P-type doped layer intended to form the base of the transistor encapsulated in a silicon-germanium portion (SiGe) comprising substitutional-site carbon inclusions (C). To be in substitutional site and obtain a single-crystal SiGeC lattice, the carbon must be incorporated upon epitaxy at a sufficiently low temperature. However, it has already been noted that, to be selective in the presence of nitride, the epitaxy must be performed at high temperature, on the order of 700° C. The presence of nitride layer 7 thus limits the amount of carbon that can be incorporated.

BRIEF SUMMARY OF THE INVENTION

In one embodiment, the present invention provides a method for forming a bipolar transistor with improved electric performances and capable of overcoming the disadvantages of known methods.

Specifically, one embodiment of the present invention provides a method for forming a bipolar transistor in a semiconductor substrate of a first conductivity type, comprising the steps of:

forming on the substrate a single-crystal silicon-germanium layer;

forming a heavily-doped single-crystal silicon layer of a second conductivity type;

forming a silicon oxide layer;

opening a window in the silicon oxide and silicon layers;

forming on the walls of the window a silicon nitride spacer;

removing the silicon-germanium layer from the bottom of the window;

forming in the cavity resulting from the previous removal a heavily-doped single-crystal semiconductor layer of the second conductivity type; and forming in said window the emitter of the transistor.

According to an embodiment of the present invention, after forming the heavily-doped single crystal semiconductor layer in the cavity, the method further comprises:

locally opening at least the silicon oxide and silicon layers to expose the upper surface of the silicon-germanium layer;

at least partially removing the silicon-germanium layer; and depositing a silicon oxide layer to fill the recess resulting from the removal of the silicon layer.

According to another embodiment of the present invention, after forming the emitter, the method further comprises:

locally opening at least the silicon oxide and silicon layers to expose the upper surface of the silicon-germanium layer;

at least partially removing the silicon-germanium layer; and depositing a silicon oxide layer to fill the recess resulting from the removal of the silicon layer.

According to another embodiment of the present invention, of the step of removing the silicon-germanium layer is implemented to completely remove said layer.

The foregoing and other objects, features, and advantages of the present invention will be discussed in detail in the following non-limiting description of specific embodiments in connection with the accompanying drawings.

DETAILED DESCRIPTION OF THE INVENTION

Figure 1A:
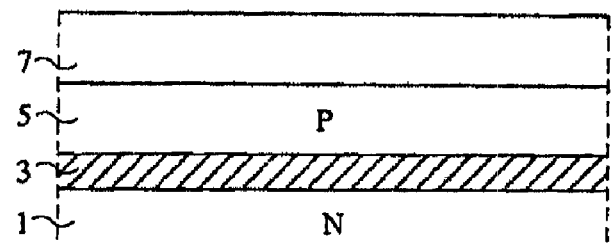
FIGS. 1A-1D illustrate, in partial simplified cross-section view, different steps of a known method for forming a bipolar transistor.
Figure 1B:
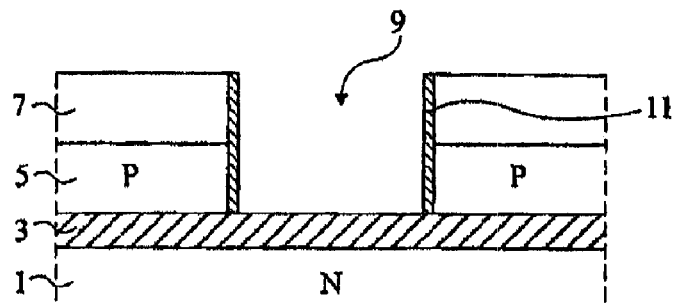
Figure 1C:
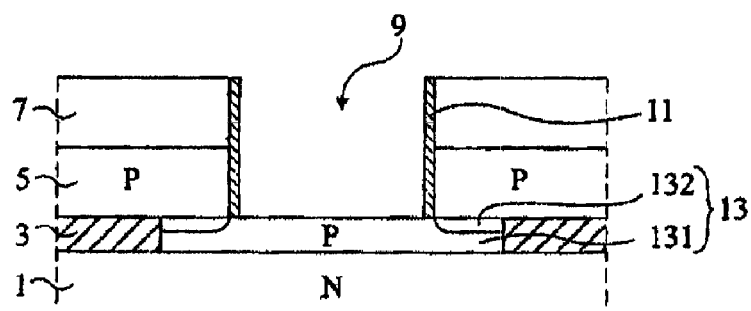
Figure 1D:
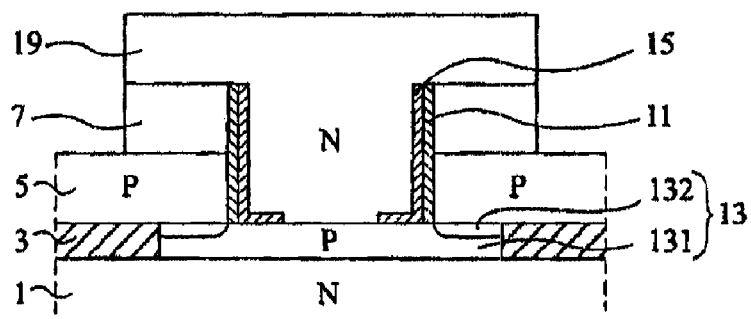

For clarity, same elements have been designated with same reference numerals in the different drawings. Further, as usual in the representation of integrated circuits, the various drawings are not to scale.

Figure 2A:
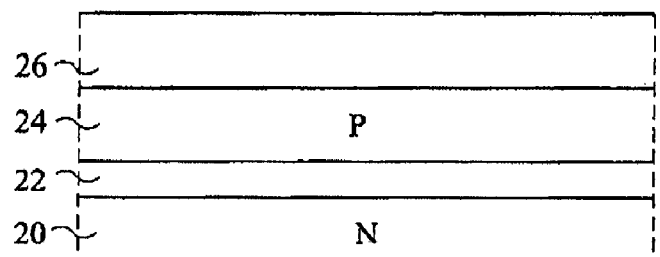
FIGS. 2A to 2E illustrate, in partial simplified cross-section view, different steps of the forming of a bipolar transistor according to the present invention.

As illustrated in FIG. 2A, a first semiconductor layer 22, a second heavily-doped P-type semiconductor layer 24, and a thick silicon oxide layer 26 are successively formed on a single-crystal semiconductor substrate, for example, a lightly-doped N-type silicon substrate 20.

First semiconductor layer 22 results from an epitaxy and is a single-crystal semiconductor layer. Layer 22 is formed of a material selectively etchable with respect to upper layer 24 and with respect to underlying substrate 1. Second semiconductor layer 24 is made of a semiconductor material selectively etchable with respect to underlying layer 22. Further, layer 24 is a single-crystal layer.

Figure 2B:
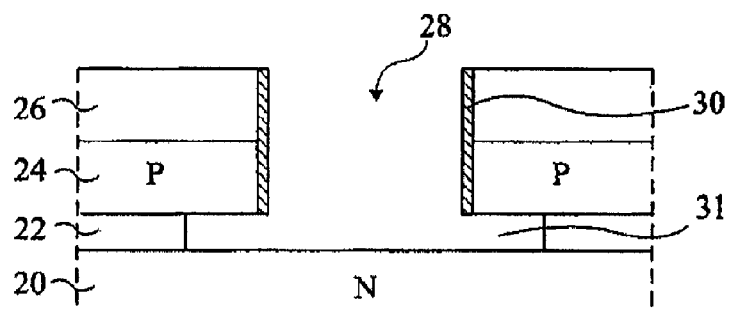

At the next steps, illustrated in FIG. 2B, a window 28 is formed in layers 26 and 24 to partially expose the upper surface of layer 22. A silicon nitride spacer 30 is formed on the walls of window 28. A cavity 31 is then formed in layer 22 from the bottom of window 28 by selectively etching layer 22. Cavity 31 extends beyond window 28 under layer 24.

Figure 2C:
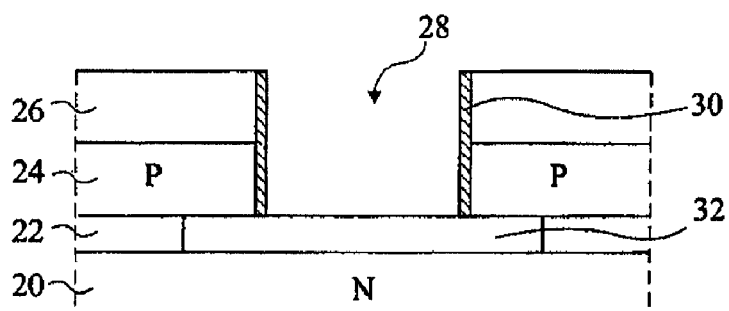

Finally, as illustrated in FIG. 2C, a semiconductor material 32 is grown by selective epitaxy. Material 32 selectively grows on the sole silicon surfaces. Material 32 thus only grows in cavity 31 on the upper surface of single-crystal substrate 20 and under single-crystal layer 24. Since layer 24 has been formed in crystalline continuity from substrate 20, material 32 will be a single-crystal material. Material 32 is intended to form the transistor base and is P-type doped. Further, preferably, the P-type dopant such as boron is "encapsulated" in a region of material 32 comprising carbon inclusions.

Figure 2D:
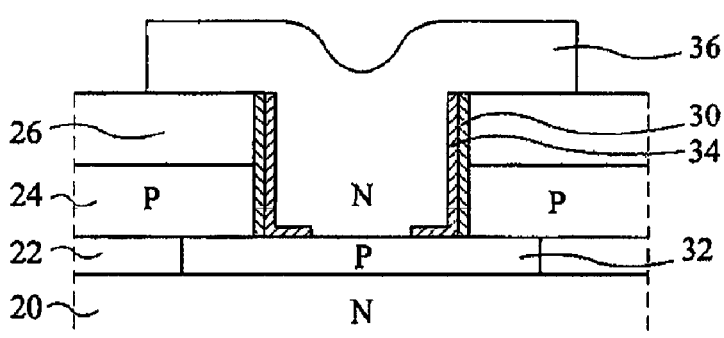

The method carries on, as illustrated in FIG. 2D, with the forming of an L-shaped spacer 34 against spacer 30. Then, the transistor emitter is defined by the deposition of a heavily-doped N-type silicon layer 36 and an etching which stops on the upper surface of silicon layer 36.

Figure 2E:
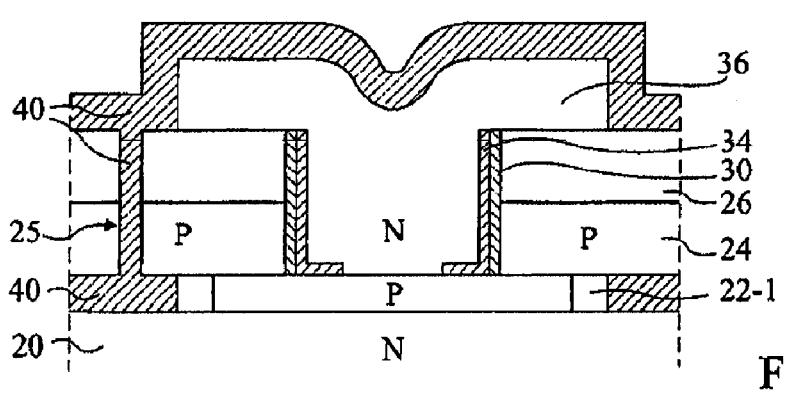

Then, as illustrated in FIG. 2E, wells 25, a single one of which is shown, are opened in silicon oxide layer 26 and semiconductor layer 24 to reach layer 22. Layer 22 is then removed by an appropriate etch method. The removal of layer 22 is performed in conditions adapted to avoiding damaging base region 32. Then, a silicon oxide layer 40 is deposited over the entire structure. Layer 40 is deposited in conditions adapted to penetrating into wells 25 and filling the recess resulting from the removal of layer 22. Layer 40 encapsulates emitter 36. For example, to guarantee the integrity of base 32, a portion 22-1 of layer 22 remains in place between insulator 40 and base region 32. The location and the number of wells 25 formed to remove layer 22 are chosen to avoid affecting the performances of base contact 24.

The method carries on with steps not shown, especially the removal of oxide layers 40 and 26 from the planar portions of emitter 36 and of base contact 24, the silicidation of the silicon surfaces thus exposed, and the forming of metallizations solid with these surfaces.

A bipolar transistor having substrate 20 as its collector, material 32 as its base, and layer 36 as its emitter has thus been formed.

As appears from the foregoing description, extrinsic base 24 of the transistor according to the present invention is monocrystalline. On one hand, this improves the electric performances of the transistor by reducing the access resistance of base 32. On the other hand, base 32 will be fully monocrystalline, which further improves the electric performances of the transistor.

Further, on epitaxy of base 32, the planar upper layer advantageously is, according to the present invention, silicon oxide layer 26. The conditions of selective growth of base 32 are less constraining. Especially, the chlorine proportion and the temperature can be lowered. It should indeed be noted that nitride spacers 30 have no bearing upon the growth selectivity. The electric performances of the resulting transistor can be further improved since carbon can be included into the base in optimal temperature conditions.

It should be noted by those skilled in the art that, in the known method described in relation with FIGS. 1A-D, it was not possible to replace upper nitride layer 7 with a silicon oxide layer due to the presence of oxide layer 3. Indeed, in the forming of a recess in oxide layer 3, as described in FIG. 1C, the upper layer 7 would be etched if it was made of silicon oxide.

As an example, according to an embodiment of the present invention, the nature and the thicknesses of the different layers are the following:

substrate 20: single-crystal silicon doped with phosphorus at $10^{17}$-$10^{18}$ at/cm$^3$;

first semiconductor layer 22: silicon-germanium layer from 10 to 100 nm, preferably from 30 to 70 nm, for example, 50 nm, comprising a germanium proportion capable of ensuring the etch selectivity with respect to underlying substrate 20 and to upper layer 24, for example, on the order of from 20 to 25%;

semiconductor layer 24: silicon layer doped with boron at $10^{20}$-$10^{21}$ at/cm$^3$, of a thickness on the order of from 50 to 100 nm;

layer 26: silicon oxide of a thickness ranging between 10 and 100 nm, for example, 70 nm;

window 28: opening ranging between 200 and 1000 nm according to the technological process used, preferably formed by dry etch;

silicon nitride spacer 30: formed by the deposition and anisotropic etch of a silicon nitride layer on the order of from 10 to 50 nm, for example, 30 nm;

removal of layer 22 from the bottom of window 28: performed by means of a selective wet etch of silicon-germanium 22 to obtain a recess beyond the window on the order of from 50 to 150 nm, for example, 100 nm; this recess ensures the contact of base region 32 with extrinsic base 24 beyond nitride spacers 30;

L-shaped spacer 34: formed of a silicon oxide sub-layer of a thickness from 5 to 10 nm, for example, 8 nm, and of an external silicon nitride layer of from 10 to 30 nm, for example, 20 nm;

emitter: formed by the deposition of a heavily-doped N-type silicon layer 36, with a $10^{20}$-$10^{21}$ at/cm$^3$ arsenic doping, of a thickness from 50 to 250 nm, for example, 150 nm; and silicon oxide layer 40: thickness selected according to the initial thickness of layer 22 to completely replace it.

Of course, the present invention is likely to have various alterations, modifications, and improvements which will readily occur to those skilled in the art. In particular, the present invention has been previously described as applied to the forming of an NPN-type bipolar transistor. However, it should be understood by those skilled in the art that the present invention also applies to the forming of PNP-type bipolar transistors.

Further, it will be within the abilities of those skilled in the art to make any dimension and doping modification of the various elements, such as, window 28, spacer 11 and 34, semiconductor layers 24 and 36, material 32, etc., according to the desired electric performances.

Further, those skilled in the art will also select the adapted etch conditions to obtain the desired results. In particular, it will be within the abilities of those skilled in the art to select the dimensions of cavity 31 (FIG. 2B) and the conditions of removal of layer 22 (FIG. 2E) to reduce to a minimum the dimension of the real final base 32/22-1, to minimize the collector-base stray capacitance.

Further, it is possible to end the bipolar transistor manufacturing once the structure of FIG. 2D has been obtained without performing the removal of layer 22 and its replacement by insulating layer 40. The choice of such an ending depends on the performances desired for the transistor, especially on the base-collector stray capacitance constraints.

It should also be noted that such a replacing could be performed from as soon as base region 32 is formed, before forming of emitter 36.

It should be noted that "substrate 20" has been used to designate a uniformly-doped silicon wafer as well as epitaxial areas and/or areas specifically doped by diffusion/implantation formed on or in a solid substrate.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

What is claimed is:

1. A method for manufacturing a bipolar transistor in a semiconductor substrate of a first conductivity type, comprising the steps of:
   forming on the substrate a single-crystal silicon-germanium layer;
   forming a heavily-doped single-crystal silicon layer of a second conductivity type overlying the single-crystal silicon-germanium layer;
   forming a silicon oxide layer overlying the single-crystal silicon layer;
   opening a window in the silicon oxide and silicon layers, thereby exposing a portion of the silicon-germanium layer at bottom of the window;
   forming on walls of the window a silicon nitride spacer;
   removing the silicon-germanium layer from the bottom of the window to provide a cavity extending beyond the bottom of the window into areas under the silicon layer;
   forming in the cavity a heavily-doped single-crystal semiconductor layer of the second conductivity type; and
   forming in said window an emitter of the transistor.

2. The method of claim 1, comprising the additional steps of:
   locally opening at least the silicon oxide and silicon layers to expose the upper surface of the silicon-germanium layer;
   at least partially removing the silicon-germanium layer to provide a recess extending beyond the opening and into areas under the silicon layer; and
   depositing a silicon oxide layer to fill the recess.

3. The method of claim 2, wherein said additional steps are implemented after the step of forming the single-crystal semiconductor layer.

4. The method of claim 2, wherein said additional steps are implemented after the step of forming an emitter.

5. The method of claim 2, wherein the step of removing the silicon-germanium layer is implemented to completely remove said silicon-germanium layer.

6. A method of manufacturing a bipolar transistor on a semiconductor substrate of a first conductivity type, comprising:
   epitaxially growing a sacrificial semiconductor layer on the substrate;
   epitaxially growing a first semiconductor layer of a second conductivity type on the sacrificial semiconductor layer;
   removing a portion of the first semiconductor layer to provide a first opening;
   thereby exposing a top surface of the sacrificial semiconductor layer;
   selectively removing a portion of the sacrificial semiconductor layer to extend the
   first opening to a top surface of the substrate and into areas under the first semiconductor layer;
   epitaxially growing a second semiconductor layer of the second conductivity type on the substrate within the opening; and
   forming an emitter overlying the second semiconductor layer.

7. The method of claim 6 wherein, the sacrificial semiconductor layer is a silicon-germanium layer, the first and second semiconductor layers are silicon layers.

8. The method of claim 6 wherein a portion of the first semiconductor layer not removed provides part of a base that includes the second semiconductor layer.

9. The method of claim 6 further comprising providing a spacer insulating the emitter from the first semiconductor layer.

10. The method of claim 6 further comprising:
    removing a portion the first semiconductor layer to provide a second opening, thereby exposing a top surface of the sacrificial semiconductor layer;
    selectively removing portions of the first semiconductor layer to extend the second opening to a top surface of the substrate and into areas under the first semiconductor layer, wherein the second opening and the first opening are separated by a portion of the first semiconductor layer; and
    depositing an insulating layer in the second opening.

11. A method comprising:
    providing a substrate of a single crystal semiconductor material;
    forming a first semiconductor layer on the substrate, the first semiconductor layer having a top surface;
    forming a second semiconductor layer on the top surface of the first semiconductor layer;
    forming a dielectric layer on the second semiconductor layer;
    selectively etching an opening in the dielectric layer and the second semiconductor layer, exposing a part of the top surface of the first semiconductor layer;
    forming a cavity in the first semiconductor layer by selectively etching the first semiconductor layer, the cavity extending beyond the opening in the second semiconductor layer into a portion beneath the second semiconductor layer and exposing a partial surface of the substrate; and filling the cavity by epitaxially growing a third semiconductor layer on the partial surface of the substrate, wherein the first semiconductor layer is a single crystal silicon-germanium layer.

12. The method of claim 11 wherein the opening in the dielectric layer and the second semiconductor layer is about 200 to about 1000 nm wide.

13. The method of claim 11 further comprising forming spacers on walls of the opening in the dielectric layer and the second semiconductor layer.

14. The method of claim 11 wherein the second semiconductor layer is a single crystal silicon layer.

15. The method of claim 11 wherein the second semiconductor layer and the third semiconductor layer have the same conductivity type.

16. The method of claim 11 wherein the third semiconductor layer forms a base of a bipolar transistor.

17. A method for manufacturing a bipolar transistor in a single-crystal silicon substrate of a first conductivity type, comprising the steps of:
    forming on the single-crystal silicon substrate a single crystal silicon-germanium layer;
    forming a single-crystal silicon layer of a second conductivity type on the single crystal silicon-germanium layer;
    forming a dielectric layer overlying the single crystal silicon layer of the second conductivity type;
    forming an opening through the dielectric layer and single-crystal silicon layer of the second conductivity type, the opening having a width and reaching a top surface of the silicon-germanium layer;
    etching the silicon-germanium layer to provide a cavity in the silicon-germanium layer, the cavity extending beyond the width of the opening into areas under the single crystal silicon layer of the second conductivity type; and
    forming in the cavity a single crystal semiconductor layer of the second conductivity type.

18. The method of claim 17 wherein forming the single crystal semiconductor layer comprises epitaxially growing on the single-crystal silicon substrate.

19. The method of claim 17 wherein the single crystal silicon-germanium layer comprises about 20% to 25% of germanium.

20. The method of claim 17 wherein forming the opening comprises selectively etching the dielectric layer and the single crystal silicon-germanium layer without etching the single crystal silicon layer.

* * * * *